(12) United States Patent
Fink et al.

(10) Patent No.: US 6,483,183 B1
(45) Date of Patent: Nov. 19, 2002

(54) INTEGRATED CIRCUIT (IC) PACKAGE WITH A MICROCONTROLLER HAVING AN N-BIT BUS AND UP TO N-PINS COUPLED TO THE MICROCONTROLLER

(75) Inventors: Scott Fink, Glendale, AZ (US); Gregory Bingham, Gilbert, AZ (US); Richard Hull, Chandler, AZ (US); Scott Ellison, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/522,026

(22) Filed: Oct. 8, 1998

Related U.S. Application Data

(63) Continuation of application No. 08/644,916, filed on May 24, 1996, now Pat. No. 5,847,450.

(51) Int. Cl.[7] .............................................. H01L 23/48
(52) U.S. Cl. ........................................ 257/697; 257/691
(58) Field of Search ................................ 257/697, 723, 257/701, 786, 689, 691; 395/674, 705, 806.25, 800.01

(56) References Cited

U.S. PATENT DOCUMENTS

| | | | |
|---|---|---|---|
| 4,866,508 A | 9/1989 | Eichelburger et al. | |
| 5,386,579 A | 1/1995 | Bourekas et al. | |
| 5,463,249 A | 10/1995 | Shinbo et al. | |
| 5,502,333 A | 3/1996 | Bertin et al. | |
| 5,787,299 A | 7/1998 | Ostler et al. | |

FOREIGN PATENT DOCUMENTS

| | | |
|---|---|---|
| JP | 5054153 | 3/1993 |
| JP | 5166391 | 7/1993 |
| JP | 6168345 | 6/1994 |

*Primary Examiner*—Roy Potter
(74) *Attorney, Agent, or Firm*—Baker Botts L.L.P.

(57) ABSTRACT

An Integrated Circuit (IC) package is disclosed comprising an IC chip with a microcontroller therein having an n-bit data bus, and up to n pins electrically coupled to the microcontroller. The IC package also includes a control register coupled to the microcontroller for receiving enable and disable signals from the microcontroller. One or more of the pins have one or more functional block associated thereto. Each functional block defines a specified function for its corresponding pin. Thus, each pin having a plurality of corresponding functional blocks has a number of potential functions equal to the number of corresponding functional blocks. The specific function for a given pin is selected by the enable signal from the control register which selects the appropriate functional block appropriate command from the microcontroller. By using pins with multiple functions, the instant invention permits an n-bit architecture microcontroller to use less than or equal to n pins.

4 Claims, 1 Drawing Sheet

INTEGRATED CIRCUIT (IC) PACKAGE WITH A MICROCONTROLLER HAVING AN N-BIT BUS AND UP TO N-PINS COUPLED TO THE MICROCONTROLLER

RELATED APPLICATION

This application is a continuation of commonly owned U.S. patent application Ser. No. 08/644,916, filed May 24, 1996, now U.S. Pat. No. 5,847,450, issued Dec. 8, 1998.

BACKGROUND OF THE INVENTION

1. Field of the Invention

This invention is in the field of microcontrollers and methods therefor and, more particularly, is a microcontroller having an n-bit architecture (i.e., data bus width) with less than n Input/Output (I/O) pins and a method therefore.

2. Description of the Related Art

Microcontrollers are widely known and used in many different applications. A typical architecture used in microcontrollers today is the 8-bit architecture (i.e., the data bus width of the microcontroller is 8 bits wide). One problem with this and other sizes of microcontrollers is that to support an n-bit architecture, greater than n pins are required to be connected to the microcontroller. By reducing the number of pins required to support an n-bit, or more particularly, an 8-bit microcontroller, the overall cost of using the device is reduced, and limited space is conserved. Therefore, there existed a need to provide a microcontroller having an n-bit architecture with less than or equal to n pins and a method therefor.

SUMMARY OF THE INVENTION

An object of the present invention is to provide a microcontroller having an n-bit architecture with less than or equal to n pins coupled to the microcontroller and a method therefor.

Another object of the present invention is to provide a microcontroller having an n bit architecture with the number of I/O pins less than n and a method therefor.

Yet another object of the present invention is to provide a microcontroller package with pins for performing multiple functions and a method therefor.

Still another object of the present invention is to provide a microcontroller with n-bit data processing capability and fewer than n I/O pins and a method therefor.

BRIEF DESCRIPTION OF THE PREFERRED EMBODIMENTS

According to the present invention, an Integrated Circuit (IC) package is disclosed comprising, in combination, an IC chip with a microcontroller therein having an n-bit data bus, and up to n pins electrically coupled to the microcontroller. The IC package further comprises control register means coupled to the microcontroller for receiving enable and disable signals. Pin function configuration means are also included coupled to the control register means for determining a function for a corresponding one of the n pins. The pin function configuration means comprises at least one functional block means coupled to the control register means for determining a function for a corresponding pin. The pin function configuration means may comprise a plurality of the functional block means each coupled to the control register means and to a corresponding pin of the n pins for determining a different function for the corresponding one of the n pins. The control register means provides independent control line means to each functional block means for transferring to each function block means one of the enable and the disable signals. Only one of the functional block means per pin is enabled at a time by the enable signal to configure a corresponding pin for a function associated with the enabled functional block means. Each functional block means is coupled to a corresponding one of the n pins and to the microcontroller for transferring data between the corresponding pin and the microcontroller when a particular one of the functional blocks is enabled. Additionally, the n pins include a number of Input/Output (I/O) type pins less than n.

Alternatively, a method of operating an Integrated Circuit (IC) package is disclosed comprising the steps of providing an IC chip with a microcontroller therein having an n-bit data bus, and providing up to n pins electrically coupled to the microcontroller.

The foregoing and other objects, features, and advantages of the invention will be apparent from the following, more particular, description of the preferred embodiments of the invention, as illustrated in the accompanying drawing.

DESCRIPTION OF THE PREFERRED EMBODIMENTS

Figure 1:
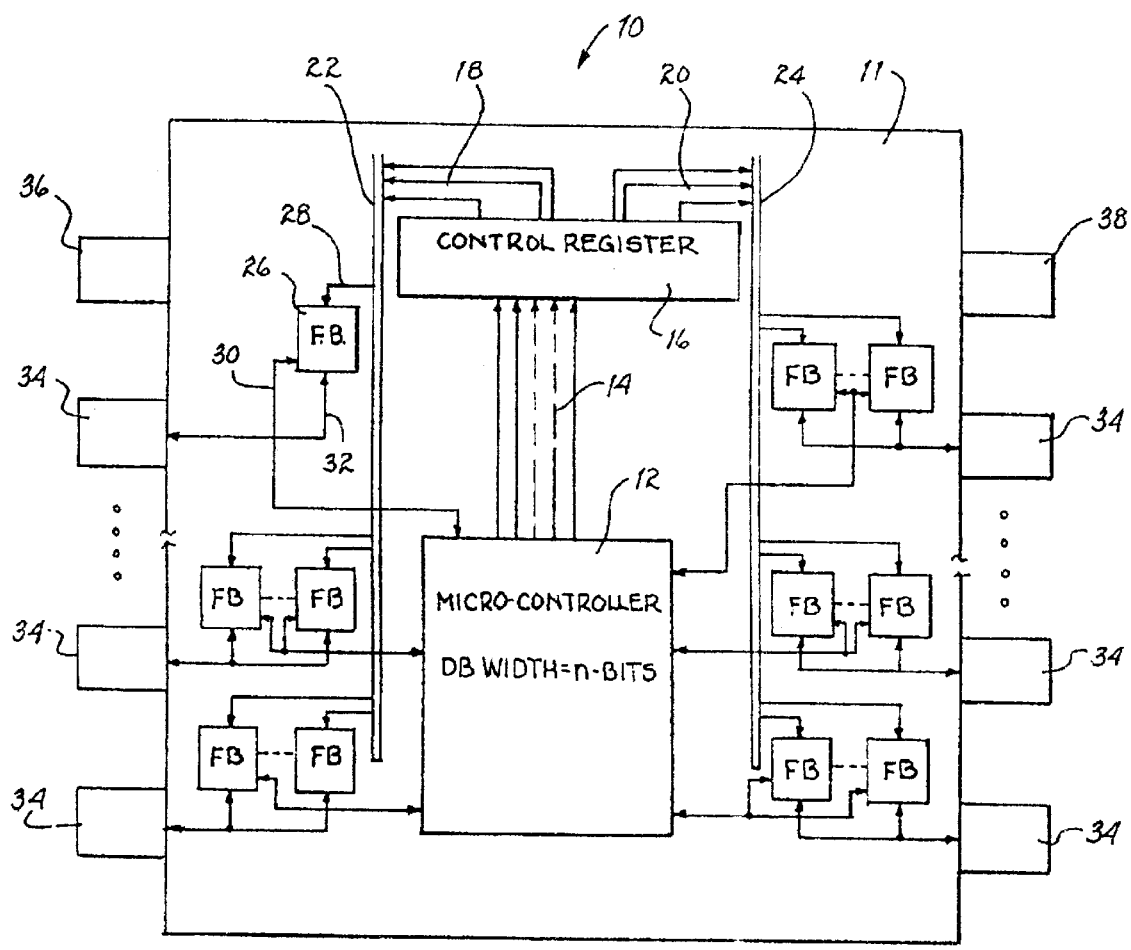
FIG. 1 is a simplified block diagram view of the IC microcontroller package having an n-bit data bus and n pins.

Referring to FIG. 1, the IC package or package of the instant invention is shown and generally designated by reference number 10. IC package 10 comprises an IC chip 11 with a microcontroller core or simply microcontroller 12 therein having an n-bit Data Bus (DB), and up to n pins 34–38 electrically coupled to the microcontroller 12. The manner of fabricating IC packages 10, chips 11, and microcontrollers 12 are well known to those skilled in the art. Microcontroller 12 has, in general, an n-bit wide data bus, but more specifically here an 8-bit architecture or data bus width. Note that the data bus itself is not shown in detail for simplification of the drawing.

The IC package 10 further comprises a control register 16 coupled to the microcontroller 12 via a control signal bus 14 for receiving enable and disable signals from the microcontroller 12. Control registers are well known to those skilled in the art. The control register 16 can be any element that can hold a known state (i.e., charge, current, or voltage) such as SRAM, DRAM, EPROM, EEPROM, ROM, Combinational Logic, PROM, or the like. The control register 16 provides sufficient memory capacity to store and transfer the enable and disable signals sent from the microcontroller 12 to the functional blocks 26, which will be described later. The communications protocol for sending the enable and disable signals from the microcontroller 12 to the functional blocks 26 via the control register 16 is well known to those skilled in the art. The enable and disable signals are routed from the control register 16 to the appropriate functional blocks 26 via buses 18–24. From buses 22 and 24, each functional block 26 is coupled via connector 28 to receive the enable or disable signal sent from the control register 16. Note also that each functional block 26 has a connection 32 to a respective pin 34 to transfer data to or from the pin 34. Additionally, each functional block 26 has a connection 30 to the microcontroller 12 to transfer to or receive from the microcontroller 12 the appropriate data.

Note that pins 36 and 38 have no functional blocks 26 coupled thereto. This is because these pins 36 and 38 are the power and ground supply pins for the package 10, and therefore, they require no functional blocks 26. Note that the individual power and ground lines from pins 36 and 38 are not shown for simplification of the drawing. Pins 34 represent either input only or I/O type pins, both of which are well known in the art. Which of pins 34 are input only and which are I/O type depends on the user's application. Note that the second pin 34 from the top left corner of the package 10 only has one functional block 26 coupled to it. Thus, this particular pin 34 has only one function associated with it. Note that this single function depiction is shown only for the purpose of demonstrating how a single function pin 34 would look. Thus, any of the pins 34 could be single function pins, or multiple function pins 34. Additionally, note that the other pins 34 are shown with two functional blocks 26 per pin 34, and therefor these pins 34 have two functions. In other words, the number of functions per pin 34 equals the number of functional blocks associated with that pin 34. Accordingly, any of the pins 34 could have one, two, or more functional blocks 26 associated thereto. This is represented in the drawing by the dashed lines between the functional blocks 26. Additionally note the dashed lines between pins 34, which indicate that this package 10 could have more or less than eight pins 34–38, but the key is that the number of pins 34–38 is less than or equal to the data bus width of the microcontroller 12.

The pin function configuration portion of the package 10 is defined as simply one or more functional blocks 26. The internals of the functional blocks 26 are not shown for simplification of the drawing. The functions that pins 34–38 must support for a microcontroller 12 are well known to those skilled in the art such as a Bi-Directional I/O Port pin, a Serial Programming Data pin, a Serial Programming Clock pin, and the like. The point is that there are many functions that pins 34–38 support for a microcontroller 12, they are all well known, and need not be specifically designated. Further, functional blocks 26, which enable a particular pin 34–38 to behave as required for a given function, are also well known in the art, and therefore need not be shown in detail. A key feature of the instant invention is that because pins 34 are multifunctional, only n pins 34–38 are required and all data control commands for the microcontroller 12 having an n-bit (i.e., 8-bit) data bus use the full n-bit bus.

OPERATION

Referring to FIG. 1, when executing an instruction, the microcontroller 12 sends appropriate control signals to the control register 16, which enables and disables the appropriate functional blocks 26 for a given pin 34. Note that since several functional blocks 26 can be used per pin 34, only one functional block can be enabled at a time. Data travels into the package 10 from a pin 34, through a corresponding connector 32, the enabled functional block 26, a corresponding connector 30, and to the microcontroller 12. The reverse path sends data from the microcontroller 12 out of a particular pin 34 of the package 10. Whether the flowpath of data be into or out of the microcontroller 12, the microcontroller 12 sends appropriate enable and disable signals to the appropriate functional blocks 26 in order to operate the desired pins 34 as required.

Although the invention has been particularly shown and described with reference to a preferred embodiment thereof, it will be understood by those skilled in the art that changes in form and detail may be made therein without departing from the spirit and scope of the invention.

What is claimed is:

1. An integrated circuit (IC) package, comprising:

an IC chip with a microcontroller therein, the microcontroller having an n-bit bus; and up to n-pins electrically coupled to the microcontroller.

2. The IC package of claim 1, wherein at least one of the up to n-pins is a multiple function pin.

3. An integrated circuit (IC) package, comprising:

an IC chip with a microcontroller therein, the microcontroller having an eight-bit bus; and eight pins electrically coupled to the microcontroller.

4. The IC package of claim 3, wherein at least one of the eight pins is a multiple function pin.

* * * * *

(12) EX PARTE REEXAMINATION CERTIFICATE (7932nd)
United States Patent
Fink et al.

(10) Number: US 6,483,183 C1
(45) Certificate Issued: Dec. 14, 2010

(54) INTEGRATED CIRCUIT (IC) PACKAGE WITH A MICROCONTROLLER HAVING AN N-BIT BUS AND UP TO N-PINS COUPLED TO THE MICROCONTROLLER

(75) Inventors: Scott Fink, Glendale, AZ (US); Gregory Bingham, Gilbert, AZ (US); Richard Hull, Chandler, AZ (US); Scott Ellison, Chandler, AZ (US)

(73) Assignee: Microchip Technology, Inc., Chandler, AZ (US)

Reexamination Request:
No. 90/007,877, Jan. 10, 2006

Reexamination Certificate for:
Patent No.: 6,483,183
Issued: Nov. 19, 2002
Appl. No.: 09/522,026
Filed: Oct. 8, 1998

Related U.S. Application Data

(63) Continuation of application No. 08/644,916, filed on May 24, 1996, now Pat. No. 5,847,450.

(51) Int. Cl.
*G06F 15/78* (2006.01)
*G06F 15/76* (2006.01)
*G11C 5/06* (2006.01)

(52) U.S. Cl. .................................... 257/697; 257/691
(58) Field of Classification Search ................ None
See application file for complete search history.

(56) References Cited

U.S. PATENT DOCUMENTS

| 4,286,321 | A | | 8/1981 | Baker et al. ................ 364/200 |
|---|---|---|---|---|
| 4,349,870 | A | | 9/1982 | Shaw et al. |
| 4,479,178 | A | * | 10/1984 | Schabowski ............... 710/305 |
| 4,656,620 | A | | 4/1987 | Cox ............................ 370/58 |
| 4,742,215 | A | | 5/1988 | Daughters et al. |
| 4,866,508 | A | | 9/1989 | Eichelberger et al. ........ 326/41 |
| 5,127,057 | A | * | 6/1992 | Chapman .................... 381/86 |
| 5,179,716 | A | | 1/1993 | Agrawal et al. |
| 5,274,778 | A | * | 12/1993 | Hall ....................... 365/185.21 |
| 5,351,216 | A | | 9/1994 | Salt et al. ............... 365/230.01 |
| 5,428,252 | A | | 6/1995 | Walker et al. ................ 307/64 |
| 5,434,862 | A | | 7/1995 | Lokhoff .................... 370/85.11 |
| 5,455,455 | A | * | 10/1995 | Badehi ....................... 257/690 |
| 5,463,249 | A | | 10/1995 | Shinbo et al. .............. 257/690 |
| 5,469,557 | A | | 11/1995 | Salt et al. .................... 711/103 |

(Continued)

FOREIGN PATENT DOCUMENTS

| JP | 3 28985 A | 2/1991 |
|---|---|---|
| JP | 5 250497 A | 9/1993 |
| JP | 6314345 | 11/1994 |
| JP | 8 95744 A | 4/1996 |

OTHER PUBLICATIONS

Derwent Abstract for EP 1 530 106 A2.*
Article entitled "Electronics Components", The Engineer, published Jan. 15, 2000, available at http://www.theengineer.co.uk/Articles/271491/+ELECTRONIC+COMPONENTS.htm.*

(Continued)

*Primary Examiner*—Erik Kielin

(57) ABSTRACT

An Integrated Circuit (IC) package is disclosed comprising an IC chip with a microcontroller therein having an n-bit data bus, and up to n pins electrically coupled to the microcontroller. The IC package also includes a control register coupled to the microcontroller for receiving enable and disable signals from the microcontroller. One or more of the pins have one or more functional block associated thereto. Each functional block defines a specified function for its corresponding pin. Thus, each pin having a plurality of corresponding functional blocks has a number of potential functions equal to the number of corresponding functional blocks. The specific function for a given pin is selected by the enable signal from the control register which selects the appropriate functional block appropriate command from the microcontroller. By using pins with multiple functions, the instant invention permits an n-bit architecture microcontroller to use less than or equal to n pins.

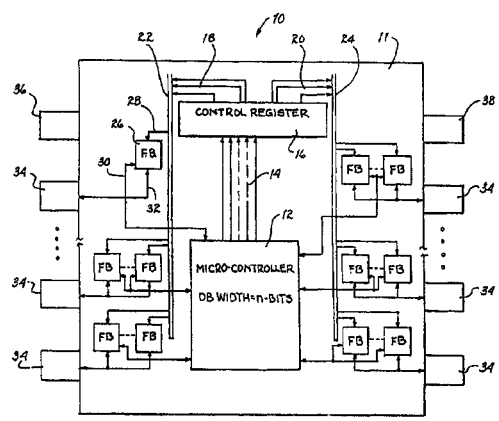

U.S. PATENT DOCUMENTS

| | | | |
|---|---|---|---|
| 5,517,661 A | | 5/1996 | Yokouchi |
| 5,615,228 A | | 3/1997 | Soenen ....................... 375/238 |
| 5,617,082 A | | 4/1997 | Denison et al. ......... 340/825.31 |
| 5,752,512 A | * | 5/1998 | Gozani ....................... 600/347 |
| 5,781,746 A | * | 7/1998 | Fleck ......................... 710/306 |
| 5,787,299 A | | 7/1998 | Ostler et al. .................. 712/39 |
| 5,826,068 A | | 10/1998 | Gates .......................... 395/559 |
| 6,243,654 B1 | * | 6/2001 | Johnson et al. ................ 702/85 |
| 2003/0126507 A1 | * | 7/2003 | Ardissono et al. ............. 714/38 |
| 2005/0181341 A1 | * | 8/2005 | Ewing et al. ................. 434/262 |
| 2007/0198816 A1 | * | 8/2007 | Ling ........................... 712/227 |

OTHER PUBLICATIONS

Jan Axelson, The Microcontroller Idea Book, Lakeview Research, Madison WI, 1994, 1997, pp. 6–7.*

Definition of "integrated circuit package" from URL: http://www.intota.com/ multisearch.asp?strSearchType=all&strQuery=integrated–circuit+package.*

Data sheet for Intel Corporation model "8XC152JA/JB/JC/JD Universal Communication Controller 8–Bit Microcontroller," Oct. 1989, pp. 1–17.

Data sheet for Philips Semiconductors models MAB8048H/35HL, MAB8049H/39HL, and MAB8050H/40HL, "Single–Chip 8–Bit Microcontroller," Aug. 1990, pp. 29–54.

Brief Data sheet for SGS–Thomson Microelectronics model ST16CF54, "CMOS MCU Based Safeguarded Smart Card IC With Modular Arithmetic Processor," 1995, 4 pages.

Brief Data sheet for SGS–Thomson Microelectronics model ST16RF48, "CMOS Based Smartcard IC With 8176 Bytes EEPROM For Contactless/Contact Applications," 2 pages.

"The F–14A Central Air Data Computer MP944 Microprocessor, F14A Microprocessor Design Paper" located at <<http://www.microcomputerhistory.com/f14paper.htm>>, 2 pages, printed Sep. 1, 2005.

Ray M. Holt, "Architecture of a Microprocessor" located at <<http://www.microcomputerhistory.com/f14paper.htm>>, 26 pages, Jan. 1971.

Ray M. Holt, "The F14A Central Air Data Computer and the LSI Technology State of the Art in 1968", located at <<http://www.microcomputerhistory.com/f14paper.htm>>, 11 pages, Sep. 22, 1998.

Ray M. Holt, "F14 TomCat MOS–LSI Chip Set", Powerpoint Presentation Slide Show file located at <<http://www.microcomputerhistory.com/f14paper.htm>>, 69 pages, Sep. 26, 1998.

"The Microcontroller Idea Book: Circuits, Programs, & Applications featuring the 8052–BASIC Microcontroller," Jan Axelson, 6 pages, Oct. 1994.

"Electronic Circuits: Design and Applications," by Ulrich Tietze and Christoph Schenk, 6 pages, 1991.

"Materials for Electronic Packaging," by Deborah D.L. Chung at Butterworth–Heinemann, 9 pages, 1995.

English Translation of Japanese Patent No. 3 28985 A (pp. 1–5), Feb. 7, 1991.

English Translation of Japanese Patent No. 5 250497 A (13 pages), Sep. 28, 1993.

English Translation of Japanese Patent No. 8 95744 A (15 pages), Apr. 12, 1996.

"Principles and Applications of EM–78 Series Chips" written by Ting–Ming Ke, 1996.

"8–bit microcontroller with OSD and VST 84C44X; 84C64X; 84C84X" by Philips Semiconductor, 1994.

"CMOS single–chip 8–bit microcontroller" by Philips Semiconductor, 1993.

"MOS integrated circuit μPD78C14(A)" by NEC, 1991.

The first page of the specification of PIC14000 controller published by Microchip, 1996.

* cited by examiner

US 6,483,183 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 3 are determined to be patentable as amended.

Claims 2 and 4, dependent on an amended claim, are determined to be patentable.

New claims 5-18 are added and determined to be patentable.

1. An integrated circuit (IC) package, comprising:
   an IC chip with a microcontroller therein, the microcontroller having an n-bit *data* bus; and
   up to n-pins electrically coupled to the microcontroller.
3. An integrated circuit (IC) package, comprising:
   an IC chip with a microcontroller therein, the microcontroller having an eight-bit *data* bus; and
   *up to* eight pins electrically coupled to the microcontroller.
5. *An electronic device comprising:*
   *an integrated circuit package comprising a left side and a right side;*
   *an IC chip with a microcontroller having an n-bit data bus arranged within said integrated circuit package;*
   *a plurality of pins extending from said left side and said right side of said integrated circuit package, said pins being electrically coupled to said microcontroller, wherein the total number of said pins is less than or equal to n.*
6. *An electronic device in accordance with claim 5, wherein said plurality of pins are equally distributed on the left side and the right side of said integrated circuit package.*
7. *An electronic device in accordance with claim 5, wherein at least one of said pins is a voltage supply pin and one of said plurality of pins is a ground pin.*
8. *An electronic device in accordance with claim 7, wherein the voltage supply pin is arranged on a side opposite a side having the ground pin arranged thereon.*
9. *An electronic device in accordance with claim 8, wherein the voltage supply pin and the ground pin are arranged closest to respective edges of said integrated circuit package.*
10. *An electronic device in accordance with claim 5, wherein the IC chip further comprises at least one functional block coupled with said microcontroller, said functional block comprising a signal input and/or output coupled with one of said plurality of pins and an enable input for enabling or disabling of the function of said functional block.*
11. *An electronic device in accordance with claim 10, further comprising at least a second functional block coupled with said microcontroller comprising a signal input and/or output coupled with said one pin and an enable input for enabling or disabling of the function of said second functional block.*
12. *An electronic device in accordance with claim 10, wherein said IC chip further comprises a control register coupled with said microcontroller and coupled with said enable input of said functional block.*
13. *An electronic device in accordance with claim 11, wherein means are provided for generating an enabling/disabling signal to feed to said functional block, wherein the enabling/disabling signals are generated such that only one functional block of a plurality of functional block coupled with the same pin is enabled at one time.*
14. *An electronic device in accordance with claim 12, wherein said IC chip further comprises a signal bus coupled with said control register and with said microcontroller for sending signals from said microcontroller to said control register to enable or disable one or more functional block.*
15. *An electronic device in accordance with claim 12, wherein said control register is a memory device.*
16. *An electronic device in accordance with claim 15, wherein said memory device is a SRAM, DRAM, EPROM, EEPROM, ROM, PROM or a logic device.*
17. *An electronic device in accordance with claim 10, wherein said functional block is a bi-directional I/O port unit.*
18. *An electronic device in accordance with claim 10, wherein said functional block is a serial programming unit.*

\* \* \* \* \*